US012660047B2

(12) United States Patent
    Kasai et al.

(10) Patent No.: US 12,660,047 B2
(45) Date of Patent: Jun. 16, 2026

(54) METHOD FOR CONTROLLING TEMPERATURE OF SUBSTRATE SUPPORT AND INSPECTION APPARATUS

(71) Applicant: TOKYO ELECTRIC LIMITED, Tokyo (JP)

(72) Inventors: Shigeru Kasai, Yamanashi (JP);
              Hiroyuki Nakayama, Yamanashi (JP);
              Yutaka Akaike, Yamanashi (JP);
              Hiroaki Komiya, Yamanashi (JP);
              Yoshiyasu Kato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 739 days.

(21) Appl. No.: 17/370,347

(22) Filed: Jul. 8, 2021

(65) Prior Publication Data

US 2022/0015193 A1     Jan. 13, 2022

(30) Foreign Application Priority Data

Jul. 9, 2020    (JP) .............................. JP2020-118348

(51) Int. Cl.
    *H05B 1/02*      (2006.01)
    *G01R 31/28*     (2006.01)
    *H05B 3/22*      (2006.01)
(52) U.S. Cl.
    CPC ....... *H05B 1/0233* (2013.01); *G01R 31/2875* (2013.01); *H05B 3/22* (2013.01)
(58) Field of Classification Search
    CPC .......... H05B 1/0233; H05B 3/20; H05B 3/22;
                 H05B 3/26; H05B 3/265; H05B 3/28;
                 H05B 3/283; H01L 21/67098; H01L
                 21/67103; H01L 21/68714

USPC ............................................ 219/443.1–444.1
See application file for complete search history.

(56) References Cited

U.S. PATENT DOCUMENTS

| | | | |
|---|---|---|---|
| 2002/0017916 A1 | 2/2002 | Costello et al. | |
| 2002/0190054 A1* | 12/2002 | Ito ..................... | H01L 21/67103 |
| | | | 219/466.1 |
| 2007/0292598 A1* | 12/2007 | Tada ....................... | H01L 22/10 |
| | | | 118/712 |
| 2009/0160472 A1* | 6/2009 | Segawa ............. | H01L 21/67248 |
| | | | 324/750.04 |

(Continued)

FOREIGN PATENT DOCUMENTS

JP        2002-184558 A      6/2002

*Primary Examiner* — Sang Y Paik
(74) *Attorney, Agent, or Firm* — Fenwick & West LLP

(57)               ABSTRACT

A method for adjusting a temperature of a substrate support is provided. In an apparatus for inspecting a target device, a substrate placement surface of the substrate support is divided into multiple regions and a heater is disposed in each of the multiple regions. The method comprises controlling the heater in a main region corresponding to the target device such that a temperature of the main region becomes a set temperature, and controlling the heater in a sub-region adjacent to the main region. When overshoot has not occurred in the temperature of the main region, the heater in the sub-region is controlled such that a temperature difference between the main region and the sub-region becomes a predetermined value, and when overshoot has occurred, the heater of the sub-region is controlled such that a difference between the set temperature and the temperature in the sub-region becomes the predetermined value.

8 Claims, 6 Drawing Sheets

(56) References Cited

U.S. PATENT DOCUMENTS

2018/0204748 A1* 7/2018 Unno ........................ H05B 3/74
2019/0338422 A1* 11/2019 Durbin ................... H05B 3/265

* cited by examiner

*FIG.5*

METHOD FOR CONTROLLING TEMPERATURE OF SUBSTRATE SUPPORT AND INSPECTION APPARATUS

CROSS-REFERENCE TO RELATED APPLICATIONS

This application claims priority to Japanese Patent Application No. 2020-118348, filed on Jul. 9, 2020, the entire contents of which are incorporated herein by reference.

TECHNICAL FIELD

The present disclosure relates to a method for controlling a temperature of a substrate support and an inspection apparatus for an inspection target device.

BACKGROUND

Japanese Patent Application Publication No. 2002-184558 discloses a heater for an inspection apparatus. This heater is formed by embedding heating elements in a disc-shaped substrate, and the substrate is formed by combining a plurality of segments. The segments include a disc-shaped segment and wide disc-shaped segments that are disposed to surround an outer periphery of the disc-shaped segment. Further, the Japanese Patent Application Publication discloses that a temperature measuring element is attached to each segment of the substrate to control a temperature of each segment.

SUMMARY

The technique of the present disclosure improves a performance of a substrate support that absorbs heat from an inspection target device, without causing warpage of the substrate support.

In accordance with an aspect of the present disclosure, there is provided a method for adjusting a temperature of a substrate support, on which a substrate is placed, in an inspection apparatus for inspecting an inspection target device formed on the substrate. A substrate placement surface of the substrate support is divided into multiple regions and a heater is disposed in each of the multiple regions. The method comprises performing feed-back control of the heater in a main region corresponding to the inspection target device among the multiple regions such that a temperature of the main region becomes a set temperature, and controlling the heater in a sub-region adjacent to the main region among the multiple regions. In said controlling the heater in the sub-region, when overshoot has not occurred in the temperature of the main region, the heater in the sub-region is controlled such that a temperature difference between the main region and the sub-region becomes a predetermined value, and when overshoot has occurred in the temperature of the main region, the heater of the sub-region is controlled such that a temperature difference between the set temperature and the temperature in the sub-region becomes the predetermined value.

BRIEF DESCRIPTION OF THE DRAWINGS

The objects and features of the present disclosure will become apparent from the following description of embodiments, given in conjunction with the accompanying drawings, in which:

FIG. 5 is a block diagram schematically showing a configuration of a control unit.

DETAILED DESCRIPTION

Figure 1:
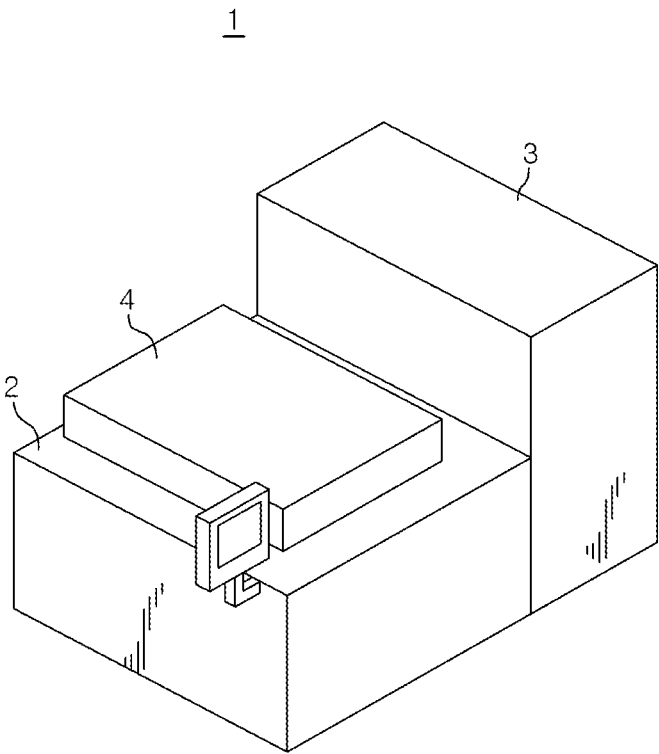
FIG. 1 is a perspective view showing a schematic configuration of an inspection apparatus according to an embodiment.

In a manufacturing process of a semiconductor device (hereinafter referred to as "device"), multiple devices are simultaneously formed on a substrate such as a semiconductor wafer (hereinafter referred to as "wafer") or the like. Electrical characteristics of the devices are inspected and the devices are classified into non-defective products or defective products. The devices are inspected with an inspection apparatus before the substrate is divided into the devices.

Further, in some inspection apparatuses, a heater or a cooling mechanism may be disposed at a substrate support on which a substrate is placed so that the electrical characteristics of the devices can be inspected at a high temperature or at a low temperature.

When the heater is disposed at the substrate support, the substrate placement surface of the substrate support may be divided into multiple regions, and a heater may be disposed in each region (see, e.g., Japanese Patent Application Publication No. 2002-184558.) In this case, for example, a temperature of each region of the substrate placement surface is measured, the heater is feedback-controlled such that the temperature of each region becomes a set temperature, and the temperature of the substrate placement surface is made to be uniform on the surface of the substrate. Hereinafter, such control is referred to as overall uniform control.

Recently, in the inspection of a logic-based integrated circuit as the device, the heat generation amount increases due to the high integration and high speed of the devices, so that it is difficult to inspect the devices formed on the substrate at once. Therefore, it is often to inspect every single device or every few devices.

However, in the case of inspecting every single device or every few devices using the above-described overall uniform control, the region where the inspection target device is located and its neighboring region have the same temperature. Therefore, the heat of the neighboring region becomes a thermal load, and the performance of the substrate support that absorbs heat from the inspection target device deteriorates. Accordingly, when the inspection target device suddenly generates heat, the temperature of the region where the inspection target device is located on the substrate placement surface may excessively exceed the set temperature.

As a method for controlling the temperature of the substrate placement surface of the substrate support, there is a method in which the heater is feedback-controlled only in the region where the inspection target device is located on the substrate placement surface and the heaters in the other regions are OFF, in addition to the above-described method. Hereinafter, such control is referred to as local centralized control. In the local centralized control, the performance of the substrate support that absorbs heat from the inspection target device is improved compared to the above-described overall uniform control. However, the temperature is high only in the region where the inspection target device is located on the substrate placement surface, and the warpage of the substrate support occurs. Accordingly, it may be difficult to perform accurate electrical characteristic inspection.

Therefore, the technique of the present disclosure improves a performance of a substrate support that absorbs heat from an inspection target device, without causing warpage of the substrate support.

Hereinafter, a method for controlling a temperature of a substrate support and an inspection apparatus according to an embodiment will be described with reference to the accompanying drawings. In this specification and the drawings, like reference numerals will be given to like parts having substantially the same functions, and redundant description thereof will be omitted.

Figure 2:
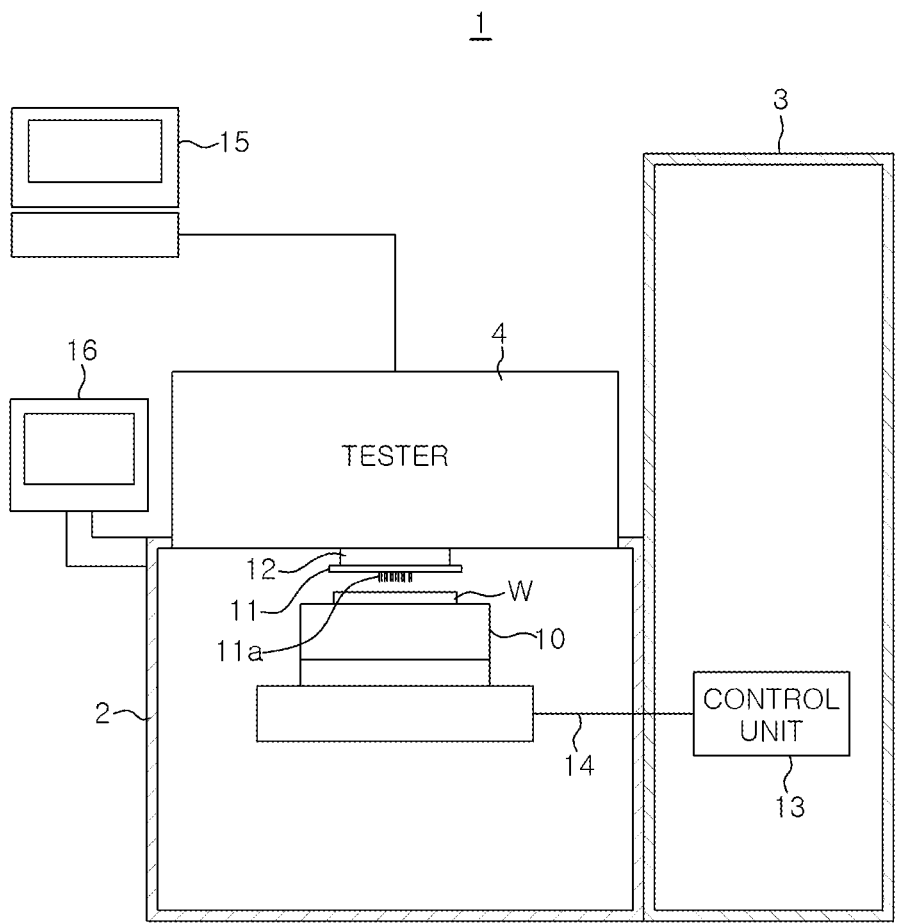
FIG. 2 is a front view showing the schematic configuration of the inspection apparatus according to the embodiment.

First, the configuration of the inspection apparatus of the present embodiment will be described. FIGS. 1 and 2 are a perspective view and a front view showing a schematic configuration of the inspection apparatus 1 of the present embodiment, respectively. In FIG. 2, a cross section of a part of the inspection apparatus 1 is shown to illustrate components of an accommodating chamber and a loader of the inspection apparatus 1 of FIG. 1.

The inspection apparatus 1 inspects electrical characteristics of devices (not shown) formed on a wafer W as a substrate. An n-number of devices (n being a natural number of 2 or more), i.e., multiple devices, are formed on the wafer W, and the inspection apparatus 1 simultaneously inspects an m-number of devices (m being a natural number smaller than n) during one inspection. In the following description, it is assumed that the number of inspection target devices is one. As shown in FIGS. 1 and 2, the inspection apparatus 1 includes an accommodating chamber 2 accommodating the wafer W during inspection, a loader 3 disposed adjacent to the accommodating chamber 2, and a tester 4 disposed to cover an upper part of the accommodating chamber 2.

As shown in FIG. 2, the accommodating chamber 2 is a hollow housing and has therein a stage 10 as a substrate support on which the wafer W is placed. The stage 10 attracts and holds the wafer W so that the position of the wafer W with respect to the stage 10 is not shifted. Further, the stage 10 is configured to be movable horizontally and vertically. With this configuration, the relative positions of a probe card 11 to be described later and the wafer W can be adjusted to bring electrodes on the surface of the wafer W into contact with probes 11a of the probe card 11.

The probe card 11 is disposed above the stage 10 in the accommodating chamber 2 to be opposed to the stage 10. The probe card 11 has the probes 11a to be in electrical contact with the electrodes of the devices formed on the wafer W.

Further, the probe card 11 is connected to the tester 4 through an interface 12. The probes 11a are in contact with the electrodes of the devices formed on the wafer W to supply a power from the tester 4 to the devices through the interface 12 and transmit signals from the devices to the tester 4 through the interface 12 during the electrical characteristic inspection.

The loader 3 takes out a wafer W accommodated in a FOUP (not shown) that is a transfer container and transfers the wafer W to the stage 10 of the accommodating chamber 2. Further, the loader 3 receives, from the stage 10, a wafer W having devices of which electrical characteristics are inspected, and accommodates the wafer W in the FOUP.

Further, the loader 3 has a control unit 13 for performing various controls such as temperature control of the stage 10, and the like. The control unit 13, which is also referred to as a base unit, is a computer including, e.g., a CPU, a memory, and the like, and includes a program storage unit (not shown). A program that controls various processes in the inspection apparatus 1 is stored in the program storage. The program may be recorded in a computer-readable storage medium and installed in the control unit 13 from the storage medium. A part or all of the program may be implemented by a dedicated hardware (circuit board). The control unit 13 is connected to the stage 10 through, e.g., a wiring 14, and controls a heating unit 120 to be described later, based on a temperature of a top plate 110 (to be described later) of the stage 10. The control unit 13 may be provided in the accommodating chamber 2.

The tester 4 has a test board (not shown) that emulates a part of a circuit configuration of a motherboard on which the devices are placed. The test board is connected to a tester computer 15 that is configured to determine whether the devices are defective or non-defective based on the signals from the devices formed on the wafer W. In the tester 4, it is possible to emulate the circuit configurations of various types of motherboards by replacing the test board.

Further, the inspection apparatus 1 includes a user interface unit 16 for displaying information for a user or allowing a user to input an instruction. The user interface unit 16 includes, e.g., an input unit such as a touch panel, a keyboard or the like, and a display unit such as a liquid crystal display or the like.

In the inspection apparatus 1 having the above-described components, when the electrical characteristics of the devices formed on the wafer W are inspected, the tester computer 15 transmits data to the test board connected to the devices through the probes 11a. Then, the tester computer 15 determines whether the transmitted data has been correctly processed by the test board based on the electric signals from the test board.

Figure 3:
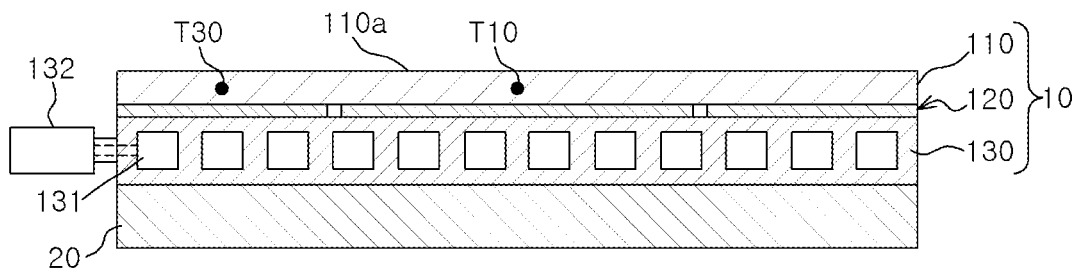
FIG. 3 is a cross-sectional view schematically showing a configuration of a stage.
Figure 4:
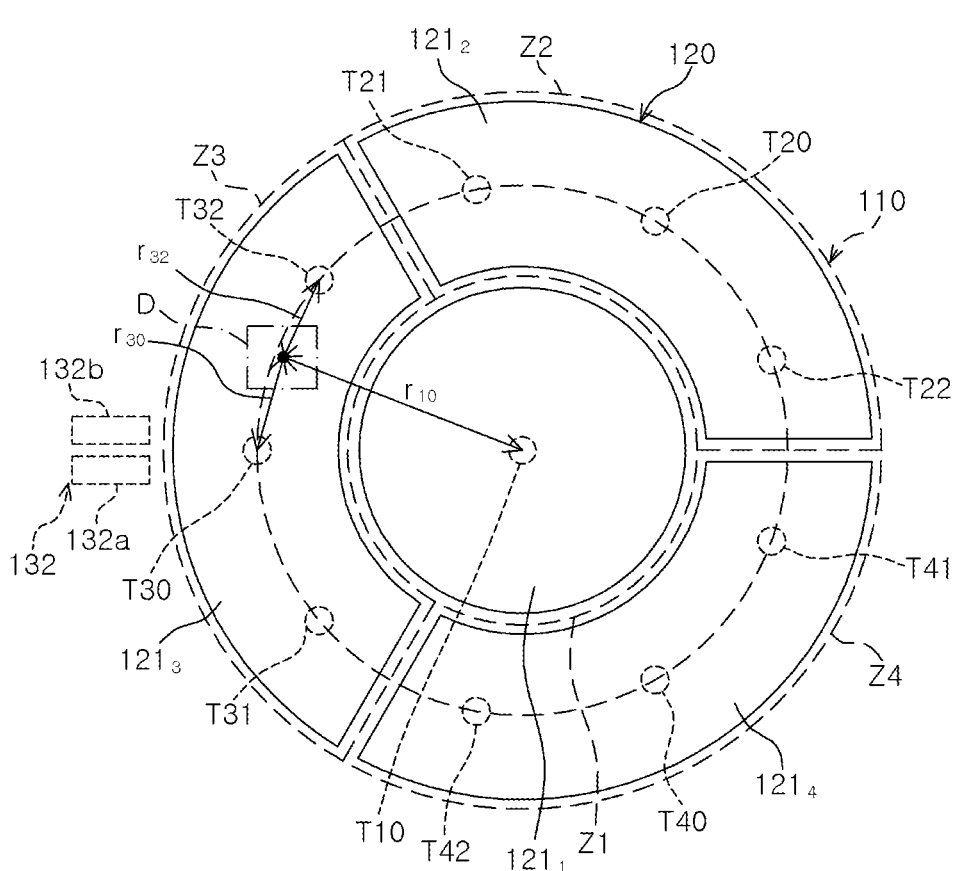
FIG. 4 is a plan view schematically showing a configuration of a heating unit.

Next, the configuration of the stage 10 will be described with reference to FIGS. 3 and 4. FIG. 3 is a cross-sectional view schematically showing a configuration of the stage 10. FIG. 4 is a plan view schematically showing a configuration of a heating unit 120 to be described later.

As shown in FIG. 3, the stage 10 is formed by stacking a plurality of functional parts including the heating unit 120. The stage 10 is placed on a moving mechanism (not shown) for moving the stage 10 in the horizontal direction and the vertical direction via a heat insulating portion 20. The heat insulating portion 20 is made of, e.g., resin, graphite, ceramic having a low thermal conductivity, or the like.

The stage 10 has a top plate 110, the heating unit 120, and a cooling unit 130 in that order from the top.

The top plate 110 is a member whose upper surface 110a serves as a wafer placement surface as a substrate placement surface on which the wafer W is placed. In the following description, the upper surface 110a of the top plate 110, which is also the upper surface of the stage 10, may be referred to as the wafer placement surface 110a. The top plate 110 is formed in a disc shape, for example. Further, the top plate 110 is made of a material having high thermal conductivity and a high Young's modulus and is thin to have a small heat capacity. Since the heat capacity of the top plate 110 is small, the temperature of the top plate 110 can be changed at a high speed by heating of the heating unit 120, for example. The top plate 110 is made of, e.g., ceramic such as SiC and AlN, and is made of a metal such as copper, aluminum, or the like when it is necessary to further reduce a production cost.

Further, as shown in FIG. 4, the wafer placement surface 110*a* of the top plate 110 is divided into a plurality of regions. Specifically, the wafer placement surface 110*a* is divided into, e.g., a circular first region Z1 located at the center and second to fourth regions Z2 to Z4 surrounding the first region Z1 and obtained by dividing an annular region into three parts in plan view.

Further, the top plate 110 has a temperature sensor T10 in the first region Z1, temperature sensors T20 to T22 in the second region Z2, temperature sensors T30 to T32 in the third region Z3, and temperature sensor T40 to T42 in the fourth region Z4. In other words, when it is assumed that each of the temperature sensors T10, T20 to T22, T30 to T32, and T40 to T42 is a temperature sensor T, the top plate 110 has at least one temperature sensor T in each of the regions Z1 to Z4 of the wafer placement surface 110*a*. Each temperature sensor T measures the temperature of the portion where the temperature sensor T is disposed on the wafer placement surface 110*a*. The temperature sensor T10 is disposed at the center of the top plate 110, for example. The temperature sensors T20 to T22, T30 to T32, and T40 to T42 are disposed at equal intervals on the same circumference about the center of the top plate 110, for example.

The heating unit 120 is a member that heats the top plate 110. As shown in FIG. 3, the heating unit 120 is disposed between the top plate 110 and the cooling unit 130. In other words, the heating unit 120 is disposed at a position closer to the wafer placement surface 110*a* than the cooling unit 130. The heating unit 120 has a built-in resistance heating element that generates heat by a power supplied thereto. The resistance heating element is made of, e.g., tungsten. Although it is not illustrated, an insulating layer made of an insulating material such as mica, polyimide, or the like, or an electromagnetic wave shielding layer made of a highly conductive material such as a metal material or the like is disposed between the heating unit 120 and the top plate 110.

Further, as shown in FIG. 4, the heating unit 120 has heaters 1211 to 1214 disposed in the first to fourth regions Z1 to Z4 of the top plate 110, respectively. Each of the heaters 1211 to 1214 has the above-described built-in resistance heating element and is individually controllable.

The heater 1211 is formed in a circular shape in plan view to correspond to the shape of the first region Z1 of the wafer placement surface 110*a*, and the heaters 1212 to 1214 are formed in a circular arc shape in plan view to correspond to the shapes of the second to fourth regions Z2 to Z4, respectively.

In the following, each of the heaters 1211 to 1214 may be referred to as a heater 121.

As shown in FIG. 3, the cooling unit 130 is disposed below the heating unit 120. The cooling unit 130 is a member that cools the top plate 110, and is formed in a disc shape, for example. A flow path 131 through which a coolant flows is formed inside the cooling unit 130. A port 132 is connected to a side portion of the cooling unit 130. As shown in FIG. 4, the port 132 has a supply port 132*a* for supplying the coolant to the flow path 131 and a discharge port 132*b* for discharging the coolant from the flow path 131.

As the coolant, it is possible to use, e.g., liquid such as fluorine-based liquid, ethylene glycol or the like, or a gas such as nitrogen or the like.

Although it is not illustrated, an electromagnetic shielding layer made of a high conductive material such as a metal or the like is disposed between the cooling unit 130 and the heating unit 120.

The heating unit 120 and the cooling unit 130 configured as described above are controlled by the control unit 13.

Figure 5:
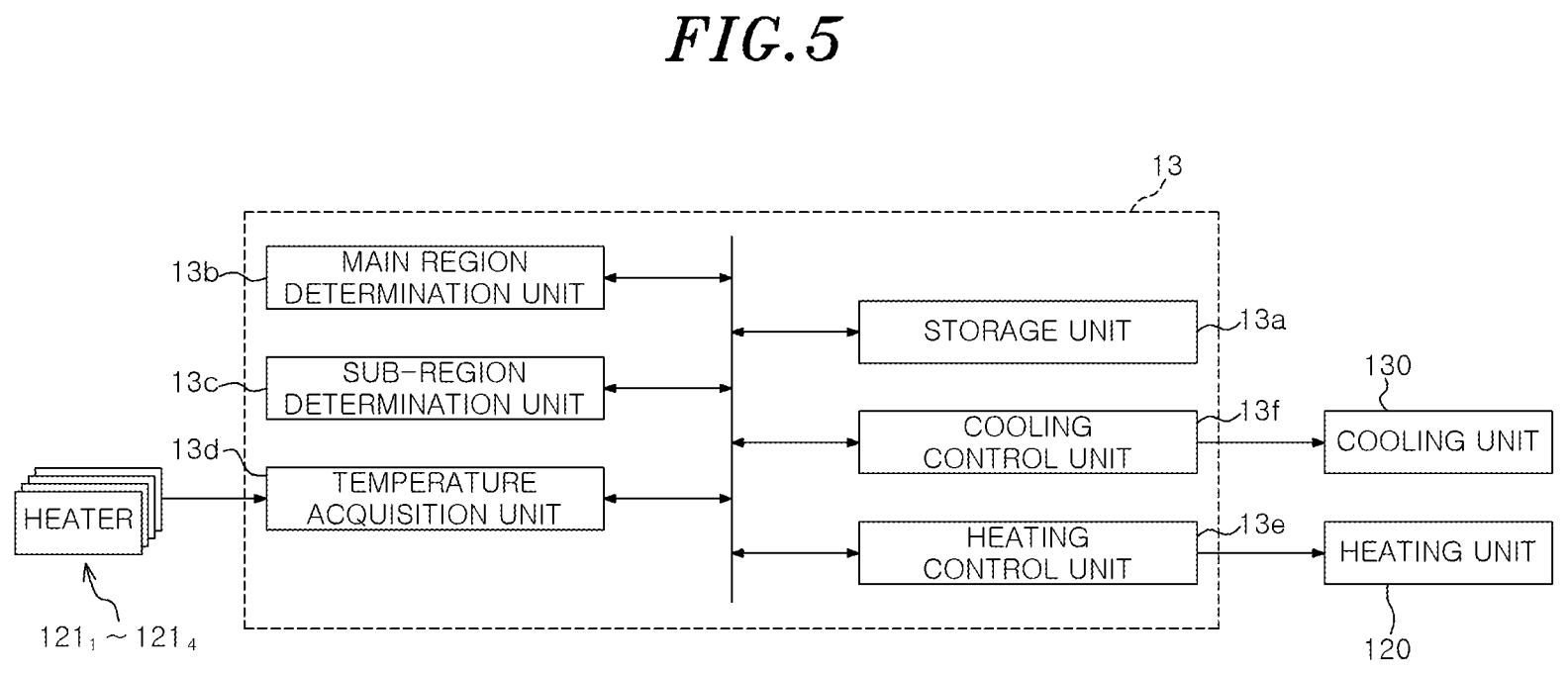

Next, the configuration of the control unit 13 for controlling the heating unit 120 and the cooling unit 130 will be described with reference to FIG. 5. FIG. 5 is a block diagram schematically showing the configuration of the control unit 13.

As shown in FIG. 5, the control unit 13 includes a storage unit 13*a*, a main region determination unit 13*b*, a sub-region determination unit 13*c*, a temperature acquisition unit 13*d*, a heating control unit 13*e*, and a cooling control unit 13*f*.

The storage unit 13*a* stores various information. For example, the storage unit 13*a* stores a set temperature of the main region Zm, or the like. Further, the storage unit 13*a* stores an offset amount to be described later in the case where each of the first to fourth regions Z1 to Z4 of the wafer placement surface 110*a* is a sub-region.

The main region determination unit 13*b* determines the main region Zm corresponding to the inspection target device D among the first to fourth regions Z1 to Z4 of the wafer placement surface 110*a* of the stage 10. The main region determination unit 13*b* determines, as the main region Zm, the region that overlaps with the position of the center of the inspection target device D among the first to fourth regions Z1 to Z4 based on the information on the position of the center of the inspection target device D, for example. In the example of FIG. 4, the third region Z3 is determined as the main region Zm.

The sub-region determination unit 13*c* determines sub-regions Zs adjacent to the main region Zm among the first to fourth regions Z1 to Z4 of the wafer placement surface 110*a* of the stage 1 based on the determination result of the main region determination unit 13*b*. For example, when the first region Z1 is the main region Zm, the second to fourth regions Z2 to Z4 are determined as the sub-regions Zs, and when the second region Z2 is the main region Zm, the first region Z1, the third region Z3, and the fourth region Z4 are determined as the sub-regions Zs.

The temperature acquisition unit 13*d* acquires the temperatures of the first to fourth regions Z1 to Z4 of the wafer placement surface 110*a* of the stage 10. Specifically, the temperature acquisition unit 13*d* acquires the temperatures of the first to fourth regions Z1 to Z4 of the wafer placement surface 110*a* of the stage 10 based on the measurement result of the temperature sensor T.

More specifically, the temperature acquisition unit 13*d* acquires the measurement result of the temperature sensor T10 as the temperature of the first region Z1, for example.

Further, the temperature acquisition unit 13*d* acquires the average value of the measurement results of the temperature sensors T20 to T22 as the temperature of the second region Z2. Similarly, the temperature acquisition unit 13*d* acquires the average value of the measurement results of the temperature sensors T30 to T32 as the temperature of the third region Z3 and acquires the average value of the measurement results of the temperature sensors T40 to T42 as the temperature of the fourth region Z4.

The temperature acquisition unit 13*d* may acquire, as the temperature of the main region Zm among the first to fourth regions Z1 to Z4, the temperature (hereinafter, may be referred to as "device position temperature") of the portion of the main region Zm where the inspection target device D is located. The device position temperature Td is calculated based on, e.g., the measurement results of the temperature sensors T around the inspection target device D and weighting corresponding to the distance between each of the temperature sensors T and the inspection target device D. In the case of weighting, the weight increases as the distance to the inspection target device D decreases. In the example of FIG. 4, the device position temperature Td is calculated by the following equation (1) based on the measurement results t30, t32, and t10 of the three temperature sensors T30, T32, and T10 close to the inspection target device D, and the distances r30, r32, and r10 between the temperature sensors T30, T31, and T10 and the inspection target device D.

$$Td=(r_{30} \cdot r_1 \cdot t_{32}+r_{32} \cdot r_{10} \cdot t_{30}+r_{32} \cdot r_{30} \cdot t_{10})/(r_{30} \cdot r_{10}+r_{32} \cdot r_{10}+ r_{32} \cdot r_{30}) \tag{1}$$

The heating control unit 13e controls the heating unit 120 based on the determination results of the main region determination unit 13b and the sub-region determination unit 13c and the acquisition result of the temperature acquisition unit 13d. Specifically, the heating control unit 13e controls the heaters 121i to 1214 of the heating unit 120. The heating control unit 13e will be described in detail later.

The cooling control unit 13f controls the cooling unit 130. Specifically, the cooling control unit 13f controls the temperature or the flow rate of the coolant flowing through the flow path 131 of the cooling unit 130 based on the set temperature of the stage 10.

In the present embodiment, the heating amount of the heating unit 120 is controlled for each region of the wafer placement surface 110a while cooling the entire wafer placement surface 110a using the cooling unit 130 under the control of the heating control unit 13e and the cooling control unit 13f The cooling unit 130 constantly performs cooling to quickly absorb the heat of the devices formed on the wafer W even when the heat is suddenly generated from the devices during the electrical characteristic inspection.

Figure 6:
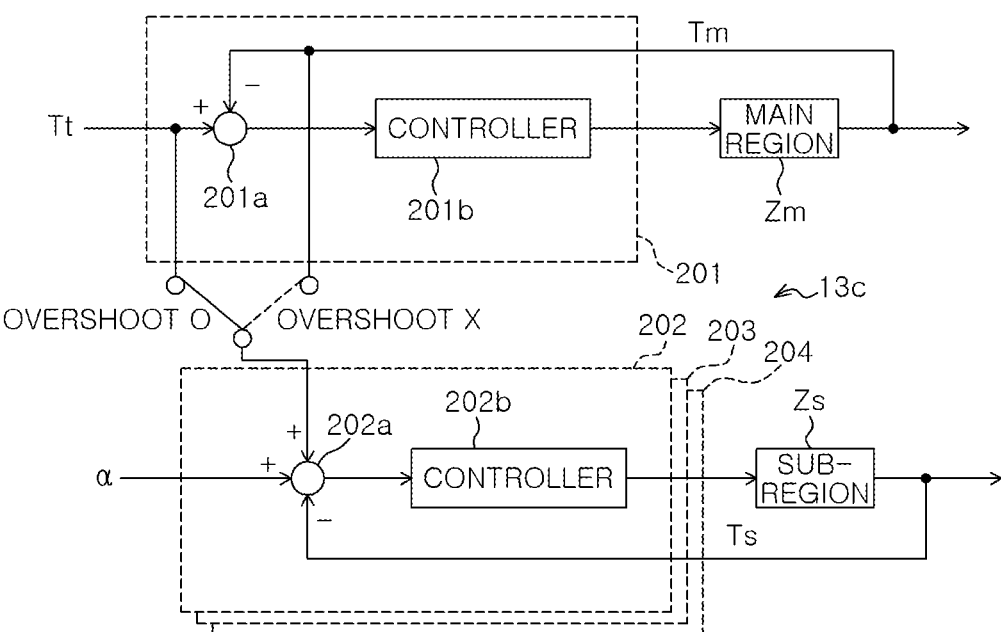
FIG. 6 is a block diagram schematically showing a configuration of a heating control unit.

Next, the configuration of the heating control unit 13e will be described with reference to FIG. 6. FIG. 6 is a block diagram schematically showing the configuration of the heating control unit 13e.

As shown in FIG. 6, the heating control unit 13e includes a main region control unit 201 and sub-region control units 202 to 204.

The main region control unit 201 controls the heater 121 in the main region Zm determined by the main region determination unit 13b. Specifically, the main region control unit 201 performs feedback-control of the heater 121 in the main region Zm such that a temperature Tm of the main region Zm becomes a set temperature Tt of the main region Zm that is a control target temperature. In other words, the main region control unit 201 performs the control operation to adjust the operation amount of the heater 121 in the main region Zm. Therefore, the main region control unit 201 includes a deviation calculator 201a for calculating a deviation Δt1 of the temperature Tm of the main region Zm acquired by the temperature acquisition unit 13d with respect to the set temperature Tt, and a controller 201b for performing the control operation (e.g., PID calculation) based on the deviation Δt1, calculating the operation amount of the heater 121 in the main region Zm, and outputting the operation amount. In the following description, it is assumed that "set temperature" refers to "set temperature of the main region Zm."

Each of the sub-region control units 202 to 204 controls the heater 121 in each of the sub-regions Zs determined by the sub-region determination unit 13c. The sub-region control units 202 to 204 control different sub-regions Zs.

The sub-region control units 202 to 204 perform different controls depending on whether or not the overshoot has occurred in the temperature Tm of the main region Zm. The overshoot occurs when the inspection target device D starts to generate heat, for example.

The sub-region control unit 202 includes a deviation calculator 202a and a controller 202b.

When the overshoot has not occurred in the temperature Tm of the main region Zm, the sub-region control unit 202 performs feedback-control of the heater 121 in the sub-region Zs to be controlled such that a temperature difference (Tt–Tm) between the main region Zm and the sub-region Zs becomes an offset amount α for the corresponding sub-region Zs. In other words, the control calculation is performed to adjust the operation amount of the heater 121 in the corresponding sub-region Zs. Specifically, when the overshoot has not occurred in the temperature Tm of the main region Zm, the deviation calculator 202a of the sub-region control unit 202 calculates a deviation Δt2 between a temperature difference (Tm–Ts) between the main region Zm and the sub-region Zs and the offset amount α, from the temperature Tm of the main region Zm and the temperature Ts of the sub-region Zs to be controlled that are acquired by the temperature acquisition unit 13d and the offset amount α. Further, the controller 202b performs the control calculation (e.g., PID calculation) based on the deviation Δt2, and calculates and outputs the operation amount of the heater 121 in the sub-region Zs to be controlled.

When the overshoot has occurred in the temperature Tm of the main region Zm, the sub-region control unit 202 performs the feedback-control of the heater 121 in the sub-region Zs such that the temperature difference between the set temperature Tt and the temperature Ts of the sub-region Zs to be controlled becomes the offset amount α for the corresponding sub-region Zs. Specifically, when the overshoot has occurred in the temperature Tm of the main region Zm, the deviation calculator 202a of the sub-region control unit 202 calculates a deviation Δt2 between the difference (Tt–Ts) between the set temperature Tt and the temperature Ts of the sub-region Zs and the offset amount α, from the set temperature Tt, the temperature Ts of the sub-region Zs to be controlled, and the offset amount α. Further, the controller 202b performs the control operation (e.g., PID calculation) based on the deviation Δt2, and calculates and outputs the operation amount of the heater 121 in the sub-region Zs to be controlled.

Since the configurations of the sub-region control units 203 and 204 are the same as that of the sub-region control units 202, the description thereof will be omitted.

The above-described offset amount α is set to prevent the heat inflow from the sub-region Zs to the main region Zm and the warpage of the wafer placement surface 110a of the stage 10. Since the offset amount α is set to prevent the warpage of the wafer placement surface 110a of the stage 10 as described above, the offset amount α varies depending on, e.g., the Young's modulus or the thickness of the top plate 110.

The offset amount α may vary depending on regions. The offset amount α is basically a negative value, but can be a positive value depending on the configuration of the stage 10. For example, the offset amount α may be set to a positive value only for the third region Z3 that is more likely to be cooled compared to other regions close to the port 132.

Further, the offset amount for the sub-region Zs may vary depending on the main region Zm.

As described above, the sub-region control unit 202 or the like performs different controls depending on whether or not the overshoot has occurred in the temperature Tm of the main region Zm.

For example, the heating control unit 13e determines whether or not the overshoot has occurred in the temperature Tm of the main region Zm.

Whether or not the overshoot has occurred in the temperature Tm of the main region Zm is determined based on, e.g., whether or not the temperature Tm of the main region Zm exceeds a reference temperature Tb (Tb≥Tt) determined based on the set temperature Tt. For example, when it exceeds the reference temperature Tb, it is determined that the overshoot has occurred, and when it does not exceed the reference temperature Tb, it is determined that the overshoot has not occurred.

Whether or not the overshoot has occurred in the temperature Tm of the main region Zm may be determined based on whether or not the temperature Tm of the main region Zm exceeds the reference temperature Tb and whether or not the operation amount of the heater 121 of the main region Zm is zero. For example, when the temperature Tm of the main region Zm exceeds the reference temperature Tb and the operation amount of the heater 121 is zero, it is determined that the overshoot has occurred. In other cases, it is determined that the overshoot has not occurred.

Further, whether or not the overshoot has occurred in the temperature of the main region Zm may be determined based on whether or not the operation amount of the heater 121 in the main region Zm is zero. For example, when the operation amount of the heater 121 is zero, it is determined that the overshoot has occurred, and when the operation amount of the heater 121 is not zero, it is determined that the overshoot has not occurred.

The information used for determining whether or not the overshoot has occurred in the temperature Tm of the main region Zm is determined by, e.g., a user, based on the content of the control operation performed by the controller 201b of the main region control unit 201.

Next, an example of the inspection process performed by the inspection apparatus 1 will be described.

In the inspection process, first, the wafer W is taken out from the FOUP of the loader 3, transferred to the stage 10, and placed on the stage 10. Next, the stage 10 is moved, and the probes 11a disposed above the stage 10 are brought into contact with the electrodes of the inspection target device on the wafer W.

Then, an inspection signal is inputted to the probes 11a. Accordingly, the electrical characteristic inspection of the inspection target devices is started. When the electrical characteristic inspection is completed, the stage 10 is moved and the same processes are performed on a next inspection target device on the wafer W.

Then, the above processes are repeated until the electrical characteristic inspection of all devices is completed.

During the electrical characteristic inspection, it is required to maintain the temperature of the inspection target device at a desired temperature. Therefore, for example, during the electrical characteristic inspection and before and after the electrical characteristic inspection, the temperature acquisition unit 13d constantly acquires the temperatures of the first to fourth regions Z1 to Z4 of the wafer placement surface 110a. Then, the heating control unit 13e performs feedback-control of the heaters 121 in the first to fourth regions Z1 to Z4 based on the acquired temperatures of the first to fourth regions Z1 to Z4, the set temperature Tt, and the offset amount α. Further, the cooling control unit 13f controls the cooling unit 130 based on the set temperature Tt. Accordingly, the temperature of the stage 10 is adjusted and the temperature of the inspection target device D is constantly maintained at a desired temperature.

The heating control in the method for controlling the temperature of the stage 10 according to the present embodiment includes:

(A) feedback-controlling the heater 121 in the main region Zm such that the temperature of the main region Zm corresponding to the inspection target device D among the regions Z1 to Z4 on the wafer placement surface 110a becomes the set temperature Tt; and (B) controlling the heater 121 in the sub-region Zs adjacent to the main region Zm among the regions Z1 to Z4 on the wafer placement surface 110a.

In the step (B), (a) when the overshoot has not occurred in temperature Tm of the main region Zm, the heaters 121 in the sub-regions Zs are controlled such that the temperature difference (Tm−Ts) between the main region Zm and each of the sub-regions Zs becomes the offset amount α for each of the sub-regions Zs, and (b) when the overshoot has occurred in the temperature Tm of the main region Zm, the heaters 121 in the sub-regions Zs are controlled such that the temperature difference (Tt−Ts) between the set temperature Tt and the temperature of each of the sub-regions Zs becomes the offset amount α.

Since the control is performed as in the step (a), when heat is suddenly generated at the inspection target device D, the amount of heat absorbed from the inspection target device D through the sub-regions Zs is increased compared to that in the overall uniform control.

Further, the case where the overshoot has not occurred in the temperature Tm of the main region Zm indicates the case where the temperature Tm of the main region Zm is lower than or equal to the set temperature Tt. In that case, in the present embodiment, the control is performed as described in the step (a). In other words, the heaters 121 in the sub-regions Zs are controlled such that the temperatures of the sub-regions Zs follow not the set temperature Tt but the temperature Tm of the main region Zm lower than the set temperature Tt. Accordingly, the heat inflow from the sub-regions Zs to the main region Zm can be prevented. Hence, in the present embodiment, the amount of heat absorbed from the inspection target device D through the sub-regions Zs is increased compared to that in the case where the heaters 121 in the sub-regions Zs are controlled such that the temperatures of the sub-regions Zs follow the set temperature Tt.

On the other hand, the case where the overshoot has occurred in the temperature Tm of the main region Zm indicates the case where the temperature Tm of the main region Zm is higher than the set temperature Tt. In that case, in the present embodiment, the control is performed as described in the step (b). In other words, the heaters 121 in the sub-regions Zs are controlled such that the temperatures of the sub-regions Zs follow not the temperature Tm of the main region Zm but the set temperature Tt lower than the temperature Tm of the main region Zm. Therefore, when the overshoot has occurred in the temperature Tm of the main region Zm, the heat of the main region Zm can be released to the sub-regions Zs. In other words, when the overshoot has occurred in the temperature Tm of the main region Zm, the amount of heat absorbed from the inspection target device D through the sub-region Zs increases. Accordingly, new overshoot can be prevented.

Further, since the control is performed as in the steps (a) and (b), the warpage of the stage 10 does not occur as in the case of the local centralized control.

Therefore, in the present embodiment, it is possible to improve the heat absorbing performance using the stage 10 without the warpage of the stage 10.

In the present embodiment, since the heat absorbing performance using the stage 10 is excellent, the temperature of the inspection target device D can be quickly returned to a desired temperature even when the heat is suddenly generated at the inspection target device D.

Further, in the present embodiment, since the warpage of the stage 10 does not occur as described above, the change in the contact resistance between the probes 11a and the inspection target device D due to the warpage of the stage 10 is prevented, which makes it possible to perform the electrical characteristics of inspection target device D appropriately.

Further, in the present embodiment, it is possible to prevent the probe card 11 from being damaged due to the warpage of the stage 10.

Further, in the present embodiment, the temperatures Ts of the sub-regions Zs are closer to the temperature Tm of the main region Zm, compared to the above-described local centralized control. Therefore, when the inspection target device D is switched and the main region Zm is switched to the region that was the sub-region Zs, the inspection target device D can reach a desired temperature quickly in the present embodiment, compared to the above-described local centralized control.

As described above, the temperature acquisition unit 13d may acquire, as the temperature Tm of the main region Zm, the device position temperature Td calculated based on the measurement results of the temperature sensors T around the inspection target device D and the weightings corresponding to the distances between the inspection target device D and the temperature sensors T. By feedback-controlling the heater 121 in the main region Zm as described in the step (A) based on the device position temperature Td that is the temperature Tm in the main region Zm, the inspection target device D can reach a desired temperature more accurately.

By increasing the number of temperature sensors T, the device position temperature Td becomes more accurate, so that the inspection target device D can reach a desired temperature more accurately.

By dividing the wafer placement surface 110a into a larger number of regions and increasing the number of heaters 121, the inspection target device D can reach a desired temperature more accurately. However, in the case of using an IC temperature sensor as the temperature sensor T, the cost increases when the number of heaters 121 is increased than when the number of temperature sensors T is increased. Therefore, it is possible to make the inspection target device reach a desired temperature more accurately at a lower cost by increasing the number of temperature sensors T than by increasing than the number of heaters 121, for example.

Further, in the present embodiment, the heating unit 120 is disposed at a position closer to the wafer placement surface 110a than the cooling unit 130. In other words, the cooling unit 130 is not disposed between the heating unit 120 and the wafer placement surface 110a. Therefore, the heat capacity of the heating unit 120 is small, so that the heating unit 120 can perform heating with high responsiveness.

In the above description, the heating unit 120 is disposed below the top plate 110 via the electromagnetic shielding layer or the like. However, the heating unit may be disposed in the top plate. In this case, when a highly conductive material such as tungsten or the like is used as the heating element of the heating unit, the base of the top plate is made of a material having a high insulating property and high thermal conductivity, such as aluminum nitride or the like.

Further, in the present embodiment, the wafer placement surface 110a is divided into multiple regions, and the wafer placement surface 110a is heated from a position closer to the cooling unit 130 by the heater 121 disposed in each region depending on the temperature of each region. Accordingly, it is possible to cope with local temperature changes on the wafer placement surface 110a by allowing the heating unit 120 having high responsiveness to heat each region. In addition to the above-described heating, the cooling unit 130 absorbs heat from the entire wafer placement surface 110a, so that it is possible to cope with local heat generation during the electrical characteristic inspection of a device having a high heat generation density.

Conventionally, unlike the present embodiment, only one of cooling and heating was performed, and the thickness of the top plate of the stage was increased to increase the heat capacity. When the inspection target device generated heat, the heat was absorbed by the heat capacity of the top plate. However, recently, the heat generation density of the device is high, and it is difficult to maintain the device having a high heat generation density at a desired temperature by the above-described conventional technique.

On the other hand, in the present embodiment, as described above, it is possible to cope with local heat generation during the electrical characteristic inspection even in a device having a high heat generation density and also possible to maintain the temperature of such a device at a desired temperature.

Further, in the above-described example, when the wafer placement surface 110a is divided into the multiple regions, each region is either the main region Zm or the sub-region Zs adjacent thereto. However, depending on the partition state of the wafer placement surface 110a, the divided regions of the wafer placement surface 110a may include a region that is neither the sub-region Zs nor the sub-region Zs. In this case, the heater 121 in the region that is neither the main region Zm nor the sub region Zs may be controlled in the same manner as the heater 121 in the main region Zm, or may be controlled in the same manner as the heater 121 in the sub-region Zs.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A method for controlling a temperature of a substrate support, on which a substrate is placed, during inspecting devices formed on the substrate, wherein a substrate placement surface of the substrate support is divided into multiple regions and a heater is disposed in each of the multiple regions, and the devices are inspected either one by one or in groups of a few devices by supplying power to the device(s) under inspection, the method comprising:

performing feed-back control of the heater in a main region that overlaps with a center of an inspection target device in plan view among the multiple regions such that a temperature of the main region becomes a set temperature; and controlling the heater in each sub-region adjacent to the main region among the multiple regions, wherein in said controlling the heater in each sub-region, when overshoot has not occurred in the temperature of the main region, the heater in the sub-region is controlled such that a temperature difference between the main region and the sub-region becomes an offset amount, wherein the offset amount is set to prevent a heat inflow from the sub-region to the main region and warpage of the substrate placement surface, and when overshoot has occurred in the temperature of the main region, the heater in the sub-region is controlled such that a temperature difference between the set temperature and the temperature in the sub-region becomes the offset amount, wherein whether or not the overshoot has occurred in the temperature of the main region is determined based on whether or not the temperature of the main region exceeds a reference temperature that is set to be higher than the set temperature, wherein the substrate support has temperature sensors in each of the regions, the method further comprising:

acquiring, as the temperature of the main region, a temperature of a portion of the main region where the inspection target device is disposed, wherein in said acquiring, the temperature of the portion of the main region where the inspection target device is disposed is acquired based on measurement results of the temperature sensors around the inspection target device and weightings corresponding to distances between the temperature sensors and the inspection target device.

2. The temperature control method of claim 1, wherein whether or not the overshoot has occurred in the temperature of the main region is determined based on whether or not a control operation amount of the heater in the main region for the temperature of the main region to be the set temperature is zero.

3. The temperature control method of claim 1, wherein the substrate support has a cooling unit configured to cool the substrate placement surface of the substrate support, and the heater disposed in each of the multiple regions is disposed at a position closer to the substrate placement surface than the cooling unit.

4. The temperature control method of claim 2, wherein the substrate support has a cooling unit configured to cool the substrate placement surface of the substrate support, and the heater disposed in each of the multiple regions is disposed at a position closer to the substrate placement surface than the cooling unit.

5. An inspection apparatus for inspecting devices formed on a substrate, comprising:

a substrate support on which a substrate is mounted; and a control unit,

wherein a substrate placement surface of the substrate support is divided into multiple regions, and a heater is disposed in each of the regions, and the devices are inspected either one by one or in groups of a few devices by supplying power to the device(s) under inspection, the control unit performs feedback-control of the heater in a main region that overlaps with a center of an inspection target device in plan view among the multiple regions such that a temperature of the main region becomes a set temperature and controls the heater in each sub-region adjacent to the main region among the multiple regions, wherein in the case of controlling the heater in each sub-region, when overshoot has not occurred in the temperature in the main region, the heater in the sub-region is controlled such that a temperature difference between the main region and the sub-region becomes an offset amount, wherein the offset amount is set to prevent a heat inflow from the sub-region to the main region and warpage of the substrate placement surface, and when overshoot has occurred in the temperature of the main region, the heater in the sub-region is controlled such that a temperature difference between the set temperature and the temperature of the sub-region becomes the offset amount, wherein whether or not the overshoot has occurred in the temperature of the main region is determined based on whether or not the temperature of the main region exceeds a reference temperature that is set to be higher than the set temperature, wherein the substrate support has temperature sensors in each of the multiple regions, and the control unit acquires, as the temperature of the main region, a temperature of a portion of the main region where the inspection target device is located, and the temperature of the portion of the main region where the inspection target device is located is acquired based on measurement results of the temperature sensors around the inspection target device and weightings corresponding to distances between the temperature sensors and the inspection target device.

6. The inspection apparatus of claim 5, wherein the control unit determines whether or not the overshoot has occurred in the temperature of the main region based on whether or not a control operation amount of the heater in the main region for the temperature of the main region to be the set temperature is zero.

7. The inspection apparatus of claim 5, wherein the substrate support has a cooling unit configured to cool the substrate placement surface of the substrate support, and the heater disposed in each of the multiple regions is disposed at a position closer to the substrate placement surface than the cooling unit.

8. The inspection apparatus of claim 6, wherein the substrate support has a cooling unit configured to cool the substrate placement surface of the substrate support, and the heater disposed in each of the multiple regions is disposed at a position closer to the substrate placement surface than the cooling unit.

* * * * *